United States Patent
Jin et al.

(10) Patent No.: US 9,666,779 B2
(45) Date of Patent: May 30, 2017

(54) SEMICONDUCTOR LIGHT EMITTING DIODE CHIP WITH CURRENT EXTENSION LAYER AND GRAPHICAL CURRENT EXTENSION LAYERS

(71) Applicant: Yangzhou Zhongke Semiconductor Lighting Co., Ltd., Yangzhou (CN)

(72) Inventors: Yuzhe Jin, Yangzhou (CN); Yaping Feng, Yangzhou (CN); Yi Zhang, Yangzhou (CN); Jiajia Li, Yangzhou (CN); Zhicong Li, Yangzhou (CN); Yijun Sun, Yangzhou (CN); Guohong Wang, Yangzhou (CN)

(73) Assignee: Yangzhou Zhongke Semiconductor Lighting Co., Ltd., Yangzhou (CN)

( * ) Notice: Subject to any disclaimer, the term of this patent is extended or adjusted under 35 U.S.C. 154(b) by 0 days.

(21) Appl. No.: 15/026,020

(22) PCT Filed: Mar. 13, 2014

(86) PCT No.: PCT/CN2014/073361
§ 371 (c)(1),
(2) Date: Mar. 30, 2016

(87) PCT Pub. No.: WO2015/074353
PCT Pub. Date: May 28, 2015

(65) Prior Publication Data
US 2016/0247989 A1    Aug. 25, 2016

(30) Foreign Application Priority Data

Nov. 25, 2013 (CN) .......................... 2013 1 0598862
Nov. 25, 2013 (CN) ..................... 2013 2 0747631 U

(51) Int. Cl.
*H01L 33/62*    (2010.01)
*H01L 33/00*    (2010.01)
(Continued)

(52) U.S. Cl.
CPC .......... *H01L 33/62* (2013.01); *H01L 33/0016* (2013.01); *H01L 33/38* (2013.01);
(Continued)

(58) Field of Classification Search
CPC ......... H01L 33/63; H01L 33/38; H01L 33/60; H01L 33/405; H01L 33/46; H01L 33/36; H01L 33/0016
See application file for complete search history.

(56) References Cited

U.S. PATENT DOCUMENTS

2004/0124422 A1* 7/2004 Sakamoto ............... H01L 33/20
257/79
2005/0127817 A1* 6/2005 Wu .......................... H01L 33/38
313/500
(Continued)

FOREIGN PATENT DOCUMENTS

CN    101009353 A    8/2007
CN    102097560 A    6/2011
(Continued)

*Primary Examiner* — Matthew Landau
*Assistant Examiner* — Grant Withers
(74) *Attorney, Agent, or Firm* — The Webb Law Firm

(57) ABSTRACT

A semiconductor light emitting diode chip relates to the field of production technologies of a light emitting diode. In the present invention, corresponding graphical current extension layers are respectively disposed below an N pad and a P pad, and in all light emitting compound areas, there is electronic compound light emitting. Compared with the prior art, an area of a light emitting compound area is increased, which can effectively improve current distribution and light emitting brightness of a chip. In addition, graphical current extension can effectively increase an adhesion of a pad on a surface and improve the reliability of a chip.

5 Claims, 1 Drawing Sheet

(51) Int. Cl.
*H01L 33/60* (2010.01)
*H01L 33/38* (2010.01)
*H01L 33/14* (2010.01)
*H01L 33/40* (2010.01)
*H01L 33/44* (2010.01)

(52) U.S. Cl.
CPC .............. *H01L 33/60* (2013.01); *H01L 33/14* (2013.01); *H01L 33/405* (2013.01); *H01L 33/44* (2013.01)

(56) References Cited

U.S. PATENT DOCUMENTS

| | | | |
|---|---|---|---|
| 2005/0156189 A1* | 7/2005 | Deguchi | H01L 33/42 257/103 |
| 2006/0255349 A1* | 11/2006 | Liu | H01L 33/20 257/94 |
| 2007/0228388 A1* | 10/2007 | Ko | H01L 33/38 257/79 |
| 2008/0210972 A1* | 9/2008 | Ko | H01L 33/38 257/99 |
| 2009/0140280 A1* | 6/2009 | Shen | H01L 33/20 257/98 |
| 2011/0062484 A1* | 3/2011 | Tanaka | H01L 33/20 257/99 |
| 2011/0114990 A1* | 5/2011 | Kim | H01L 33/38 257/99 |
| 2011/0140160 A1* | 6/2011 | Kim | H01L 33/44 257/99 |
| 2011/0147784 A1* | 6/2011 | Brockley | H01L 33/38 257/99 |
| 2011/0156065 A1* | 6/2011 | Kadan | H01L 33/382 257/88 |
| 2011/0156070 A1* | 6/2011 | Yoon | H01L 33/385 257/98 |
| 2011/0156086 A1* | 6/2011 | Kim | H01L 33/38 257/99 |
| 2011/0163346 A1* | 7/2011 | Seo | H01L 33/08 257/99 |
| 2011/0198641 A1* | 8/2011 | Yahata | H01L 33/46 257/98 |
| 2011/0210345 A1* | 9/2011 | Lim | H01L 33/20 257/88 |
| 2011/0215363 A1* | 9/2011 | Kimura | H01L 33/36 257/99 |
| 2011/0278634 A1* | 11/2011 | Na | H01L 33/38 257/99 |
| 2011/0316030 A1* | 12/2011 | Togawa | H01L 33/62 257/98 |
| 2011/0316126 A1* | 12/2011 | Emura | H01L 33/44 257/632 |
| 2012/0007129 A1* | 1/2012 | Beom | H01L 33/38 257/98 |
| 2012/0012884 A1* | 1/2012 | Muramoto | H01L 33/42 257/99 |
| 2012/0018766 A1* | 1/2012 | Emura | H01L 33/38 257/99 |
| 2012/0032213 A1* | 2/2012 | Sato | H01L 33/38 257/98 |
| 2012/0037946 A1* | 2/2012 | Yu | H01L 33/38 257/99 |
| 2012/0061642 A1* | 3/2012 | Tanaka | H01L 33/42 257/13 |
| 2012/0061711 A1* | 3/2012 | Li | H01L 33/38 257/99 |
| 2012/0085986 A1* | 4/2012 | Iwanaga | H01L 33/38 257/9 |
| 2012/0098009 A1* | 4/2012 | Kim | H01L 33/38 257/98 |
| 2012/0248490 A1* | 10/2012 | Weng | H01L 33/38 257/99 |
| 2012/0267672 A1* | 10/2012 | Jeon | H01L 33/14 257/99 |
| 2012/0280258 A1 | 11/2012 | Yeh et al. | |
| 2012/0286317 A1* | 11/2012 | Yeh | H01L 33/38 257/99 |
| 2012/0292657 A1* | 11/2012 | Li | H01L 33/20 257/99 |
| 2012/0326117 A1* | 12/2012 | Tanaka | H01L 33/38 257/13 |
| 2012/0326171 A1* | 12/2012 | Lee | H01L 33/38 257/88 |
| 2013/0032847 A1* | 2/2013 | Chuang | H01L 33/145 257/99 |
| 2013/0112943 A1* | 5/2013 | Tanaka | H01L 33/06 257/13 |
| 2013/0134867 A1* | 5/2013 | Yang | H01L 33/38 313/499 |
| 2013/0146929 A1* | 6/2013 | Kim | H01L 33/46 257/98 |
| 2013/0207153 A1* | 8/2013 | Kamiya | H01L 33/38 257/99 |
| 2013/0234192 A1* | 9/2013 | Kim | H01L 33/0008 257/98 |
| 2013/0240923 A1* | 9/2013 | Hsu | H01L 33/46 257/94 |
| 2013/0270595 A1* | 10/2013 | Shen | H01L 33/62 257/98 |
| 2014/0048840 A1* | 2/2014 | Kim | H01L 33/62 257/99 |
| 2014/0054594 A1* | 2/2014 | Katsuno | H01L 33/62 257/76 |
| 2014/0070252 A1* | 3/2014 | Lee | H01L 33/42 257/98 |
| 2014/0077221 A1* | 3/2014 | Genei | H01L 33/14 257/76 |
| 2014/0131758 A1* | 5/2014 | Shinohara | H01L 33/382 257/99 |
| 2014/0183564 A1* | 7/2014 | Sato | H01L 33/36 257/79 |
| 2014/0367720 A1* | 12/2014 | Kim | H01L 33/42 257/98 |
| 2014/0374785 A1* | 12/2014 | Oh | H01L 33/28 257/98 |
| 2015/0076445 A1* | 3/2015 | Tsou | H01L 33/38 257/13 |
| 2015/0076536 A1* | 3/2015 | Ou | H01L 27/15 257/91 |
| 2015/0123152 A1* | 5/2015 | Lin | H01L 33/002 257/95 |
| 2015/0187997 A1* | 7/2015 | Fan | H01L 33/42 257/99 |
| 2016/0020363 A1* | 1/2016 | Kitahama | H01L 33/46 438/29 |
| 2016/0064611 A1* | 3/2016 | Choi | H01L 33/382 257/98 |
| 2016/0118564 A1* | 4/2016 | Kim | H01L 33/38 257/99 |

FOREIGN PATENT DOCUMENTS

| | | |
|---|---|---|
| CN | 102110754 A | 6/2011 |
| CN | 103618042 A | 3/2014 |

* cited by examiner

# SEMICONDUCTOR LIGHT EMITTING DIODE CHIP WITH CURRENT EXTENSION LAYER AND GRAPHICAL CURRENT EXTENSION LAYERS

CROSS-REFERENCE TO RELATED APPLICATIONS

This application is the United States national phase of International Application No. PCT/CN2014/073361, filed Mar. 13, 2014, and claims priority to Chinese Application Nos. 201310598862.4 and 201320747631.0, both filed Nov. 25, 2013, the disclosures of which are hereby incorporated in their entirety by reference.

BACKGROUND

Technical Field

The present invention relates to the field of production technologies of a light emitting diode, and in particular, to production technologies of a light emitting diode chip.

Related Art

With the advancement of epitaxial technologies, brightness of a semiconductor light emitting diode is improved year by year. According to power, a chip may be divided into a large-power chip, a medium-power chip, and a small-power chip. Large power means a large-size chip. However, 5 years before, large-size and large-power brightness now has been replaced with the medium-size chip, which has lower costs. Accordingly, the medium-power chip having a medium size in the past may be replaced with an existing small-size chip. In addition, a Nitride semiconductor used to generate an epitaxial layer is not a perfect crystal. In a generation process, because generation conditions between layers are different, crystal mismatch causes defects, where the defect density is about $10^9$ cm$^{-2}$ to $10^{10}$ cm$^{-2}$. Even through a PSS substrate has been used in the prior art, there is still a defect density above $10^5$ cm$^{-2}$. Therefore, a chip having a larger size is easily affected by the defect density, which results in that the reliability of a chip is lowered, and a passing rate is lower relative to the small-size chip. Therefore, for upstream chip manufacturing, the medium and small-sized chips have higher utilization than an epitaxial chip.

However, because the medium and small-sized chips have less light emitting areas, the medium and small-sized chips also greatly affect use of the small-sized chips for higher brightness. In the prior art, two wire bonding pads, as an external positive electrode and an external negative electrode, are located on a surface of a chip. A size of a pad is equivalent to an area of a circle having a diameter of 70 to 100 um. In the prior art, a light emitting area of an N pad area is etched to make an N pad. As the size of a chip is reduced, an effect caused by loss of a chip light emitting area of a pad is more obvious. For example, a typical 10 mil×23 mil chip, an area of a pad approximately accounts for 10% of an area of an entire chip.

In addition, an existing pad is generated on a flat and smooth plane and has bad adhesion, which results in that a chip pulls off a pad and is sealed off after suffering the hot-cold alternative temperature within an encapsulation body.

SUMMARY

To resolve problems of low brightness cause by damaging of a light emitting area of a chip in the prior art and adhesion of a pad, the present invention puts forward a light emitting diode chip structure.

The present invention includes an N-type semiconductor layer, a light emitting compound layer, and a P-type semiconductor layer sequentially disposed on a rectangular substrate, and an N-type semiconductor layer that is exposed in the middle of the P-type semiconductor layer after being etched, where P-type semiconductor layers on two sides of the rectangular substrate are respectively provided with a P pad and an N pad; and a P-type semiconductor layer out of areas of the P pad and the N pad is provided with a current barrier layer, and the current barrier layer is provided with a current extension layer;

P-type semiconductor layers corresponding to the P pad and the N pad are respectively provided with graphical current extension layers, and the graphical current extension layers are respectively provided with electrical-insulating layers; and the back of the P pad and the back of the N pad are respectively provided with reflectors;

the current extension layer is provided with at least two groups of graphical P extended electrodes, and each of the P extended electrodes is electrically connected to the P pad; and the N pad is electrically connected to the N extended electrode, the N extended electrode is disposed on and is in contact with an exposed N-type semiconductor layer, and the P extended electrode is in contact with the current extension layer.

The beneficial effects of the present invention lie in that, corresponding graphical current extension layers are respectively disposed below an N pad and a P pad, and in all light emitting compound areas, there is electronic compound light emitting. Compared with the prior art, an area of a light emitting compound area is increased, which can effectively improve current distribution and light emitting brightness of a chip. In addition, graphical current extension can effectively increase an adhesion of a pad on a surface and improve the reliability of a chip.

To improve adhesion of a pad on a surface, on the basis of not affecting compound light emitting of a carrier of a semiconductor layer below a pad, according to the present invention, the graphical current extension layer is a current extension layer whose surface is of a net-dotted circular hole, and the diameter of the circular hole is less than 10 um.

In addition, a narrow side of the rectangular substrate is less than 300 um, which more benefits overflowing of a compounded photon of the pad below the semiconductor layer from a side wall.

The reflector is a conventional medium layer, aluminum layer, or platinum layer.

The electrical-insulating layer is a nitride of aluminum, an oxide of aluminum, an oxide of silicon, or a nitride layer of silicon.

DETAILED DESCRIPTION

Figure 1:
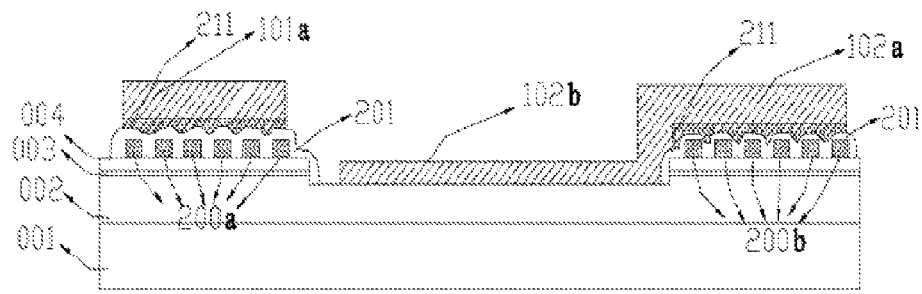
FIG. 1 is a schematic structural diagram of a sectional-layer shape of an N electrode.
Figure 2:
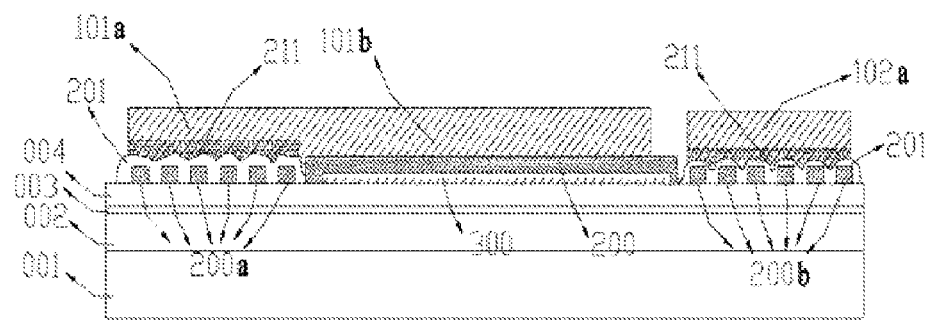
FIG. 2 is a schematic structural diagram of a sectional-layer shape of a P electrode.
Figure 3:
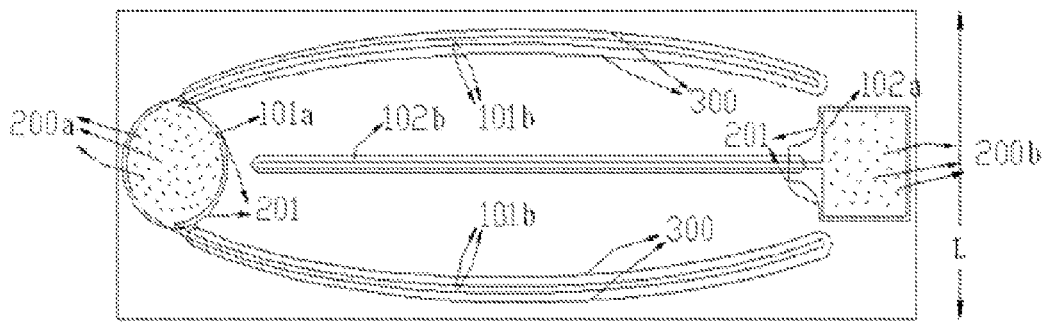
FIG. 3 is a top view of graphical current extension layer (200a) and (200b).

As shown in FIGS. 1, 2, and 3: An N-type semiconductor layer 002, a light emitting compound layer 003, and a P-type semiconductor layer 004, and an N-type semiconductor layer 002 that is exposed in the middle of the P-type semiconductor layer 004 after being etched are sequentially disposed on a rectangular substrate 001 having a narrow side L (which is as shown in FIG. 3) less than 300 um. P-type semiconductor layers 004 on two sides of the rectangular substrate 001 are respectively provided with a P pad 101a and an N pad 102a.

P-type semiconductor layers 004 corresponding to the P pad 101a and the N pad 102a are respectively provided with graphical current extension layers 200a and 200b, and the graphical current extension layers 200a and 200b are separately provided with an electrical-insulating layer 201.

The back of the P pad 101a and the back of the N pad 102a are separately provided with a reflector 211.

The P pad 101a is separately electrically connected to two groups of graphical P extended electrodes 101b, and the N pad 102a is electrically connected to an N extended electrode 102b. The N extended electrode 102b is directly disposed on the exposed N-type semiconductor layer 002, and the P extended electrode 101b is disposed on a current extension layer 200.

The P-type semiconductor layer 004 out of disposed areas of the P pad 101a and the N pad 102a is provided with a current barrier layer 300, the current barrier layer 300 is provided with the current extension layer 200, and the two groups of graphical P extended electrodes 101b are disposed on the current extension layer 200.

Graphs of the graphical current extension layer 200b below the N pad 102a and the graphical current extension layer 200a below the P pad 101a may be made by using a photolithographic process.

The reflector 211 may be a conventional medium layer (for example, SiO2/Ti3O5), aluminum layer, or platinum layer.

The electrical-insulating layer 201 is a nitride of aluminum, an oxide of aluminum, an oxide of silicon, or a nitride layer of silicon.

The current extension layers 200a and 200b are current extension layers having a net-dotted surface, and spacing between adjacent net holes is less than 10 um.

It can be seen from FIG. 3 that, for example, circular graphical current extension layers 200a and 200b, which are current extension layers whose surface graph is a net-dotted circular hole, and the diameter of the circular hole is less than 10 um.

What is claimed is:

1. A light emitting diode chip, comprising an N-type semiconductor layer, a light emitting compound layer, and a P-type semiconductor layer sequentially disposed on a rectangular substrate, and an N-type semiconductor layer that is exposed in the middle of the P-type semiconductor layer after being etched, wherein portions of the P-type semiconductor layer on two sides of the rectangular substrate are respectively provided with a P pad and an N pad; and a region of the P-type semiconductor layer outside of areas provided with the P pad and the N pad is provided with a current barrier layer, and the current barrier layer is provided with a current extension layer;

the portions of the P-type semiconductor layer corresponding to the P pad and the N pad are respectively provided with graphical current extension layers, and the graphical current extension layers are respectively provided with electrical-insulating layers; and the back of the P pad and the back of the N pad are respectively provided with reflective layers;

wherein, the current extension layer is provided with at least two graphical P extended electrodes, and each of the graphical P extended electrodes is electrically connected to the P pad; and wherein the N pad is electrically connected to a graphical N extended electrode, the graphical N extended electrode is disposed on and is in contact with the exposed N-type semiconductor layer, and each of the graphical P extended electrodes is in contact with the current extension layer.

2. The light emitting diode chip according to claim 1, wherein each graphical current extension layer has a surface which is dotted circular holes, and the diameter of each circular hole is less than 10 um.

3. The light emitting diode chip according to claim 1, wherein a narrow side of the rectangular substrate is less than 300 um.

4. The light emitting diode chip according to claim 1, wherein each reflective layer is a medium layer, an aluminum layer, or a platinum layer.

5. The light emitting diode chip according to claim 1, wherein each electrical-insulating layer is a nitride of aluminum, an oxide of aluminum, an oxide of silicon, or a nitride layer of silicon.

* * * * *